US012615888B2

(12) United States Patent
 Cai et al.

(10) Patent No.: US 12,615,888 B2
(45) Date of Patent: Apr. 28, 2026

(54) LIGHT EMITTING DIODE AND LIGHT EMITTING DEVICE USING THE SAME

(71) Applicant: Quanzhou Sanan Semiconductor Technology Co., Ltd., Quanzhou (CN)

(72) Inventors: Miaomin Cai, Quanzhou (CN); Sihe Chen, Fujian Province (CN); Yashu Zang, Fujian Province (CN); Chungchieh Yang, Quanzhou (CN); Chung-Ying Chang, Fujian Province (CN); Chi-Ming Tsai, Anhui (CN); Zhuoying Jiang, Quanzhou (CN); Yu-Chieh Huang, Fujian Province (CN); Su-Hui Lin, Fujian (CN)

(73) Assignee: QUANZHOU SANAN SEMICONDUCTOR TECHNOLOGY CO., LTD., Nanan City (CN)

( * ) Notice: Subject to any disclaimer, the term of this patent is extended or adjusted under 35 U.S.C. 154(b) by 455 days.

(21) Appl. No.: 18/450,067

(22) Filed: Aug. 15, 2023

(65) Prior Publication Data

US 2024/0063342 A1 Feb. 22, 2024

(30) Foreign Application Priority Data

Aug. 16, 2022 (CN) .......................... 202210980035.0

(51) Int. Cl.
| | |
|---|---|
| *H01L 33/32* | (2010.01) |
| *H10H 20/816* | (2025.01) |
| *H10H 20/825* | (2025.01) |
| *H10H 20/832* | (2025.01) |

(52) U.S. Cl.
CPC ...... *H10H 20/8252* (2025.01); *H10H 20/816* (2025.01); *H10H 20/835* (2025.01)

(58) Field of Classification Search
CPC ............. H10H 20/8252; H10H 20/816; H10H 20/835; H10H 20/8215
See application file for complete search history.

(56) References Cited

U.S. PATENT DOCUMENTS

2019/0148592 A1* 5/2019 Takeuchi ............. H10H 20/825
 257/103
2021/0359159 A1* 11/2021 Watanabe ........ H10H 20/01335

* cited by examiner

*Primary Examiner* — Mohammed R Alam

(74) *Attorney, Agent, or Firm* — MUNCY, GEISSLER, OLDS & LOWE, P.C.

(57) ABSTRACT

A light emitting diode includes a semiconductor structure, a first electrode, and a second electrode. The semiconductor structure has a first surface and a second surface. The semiconductor structure includes an N-type semiconductor layer, an active layer, and a P-type semiconductor layer that includes a P-type contact layer, and a P-type base layer located between the P-type contact layer and the active layer. The active layer is located between the N-type semiconductor layer and the P-type semiconductor layer. The first electrode is located on the second surface of the semiconductor structure, and is electrically connected to the N-type semiconductor layer. The second electrode is located on the second surface of the semiconductor structure, and is electrically connected to the P-type semiconductor layer. A P-type dopant concentration in the P-type contact layer gradually decreases along a direction from the first surface towards the second surface.

19 Claims, 8 Drawing Sheets

LIGHT EMITTING DIODE AND LIGHT EMITTING DEVICE USING THE SAME

CROSS-REFERENCE TO RELATED APPLICATION

This application claims priority to Chinese Invention Patent Application No. 202210980035.0, filed on Aug. 16, 2022.

FIELD

The disclosure relates to the field of semiconductor manufacturing, and more particularly to a light emitting diode and a light emitting device.

BACKGROUND

A conventional Light Emitting Diode (LED) is a semiconductor light-emitting element that is typically made of a semiconductor such as gallium nitride (GaN), gallium arsenide (GaAs), gallium phosphide (GaP), or gallium arsenide phosphide (GaAsP), etc., and that has a P-N junction with light emitting properties. LEDs offer the advantages of high luminous intensity, high efficiency, compact size, long service life, etc., and are currently considered to be one of the light sources with the most potential for future technological development.

An ultraviolet Light Emitting Diode (UV-LED) is a solid-state semiconductor device capable of directly converting electrical energy into ultraviolet light. With increasing technological development, UV-LEDs have found significant prospects in the market and a wide range of applications in the fields of biomedical care, anti-counterfeiting identification, purification (water, air, etc.), computer data storage, and military industry. In recent years, with the increasing demand for safe drinking water, daily sterilization, and disinfection, the applications of UV-LEDs have gradually become a hot topic of research. In order to improve the disinfection efficiency of UV-LEDs, light extraction from UV-LEDs should be improved as much as possible in order to achieve maximum luminous efficiency.

Therefore, how to effectively improve the luminous efficiency of UV-LEDs is a crucial technical challenge.

SUMMARY

Therefore, an object of the disclosure is to provide a light emitting diode and a light emitting device that can alleviate at least one of the drawbacks of the prior art.

According to the disclosure, the light emitting diode includes a semiconductor structure, a first electrode, and a second electrode. The semiconductor structure has a first surface and a second surface. The semiconductor structure includes an N-type semiconductor layer, an active layer, and a P-type semiconductor layer that includes a P-type contact layer, and a P-type base layer located between the P-type contact layer and the active layer. The active layer is located between the N-type semiconductor layer and the P-type semiconductor layer. The first electrode is located on the second surface of the semiconductor structure, and is electrically connected to the N-type semiconductor layer. The second electrode is located on the second surface of the semiconductor structure, and is electrically connected to the P-type semiconductor layer. A P-type dopant concentration in the P-type contact layer gradually decreases along a direction from the first surface towards the second surface.

According to another aspect of the disclosure, the light emitting device includes the aforesaid light emitting diode.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
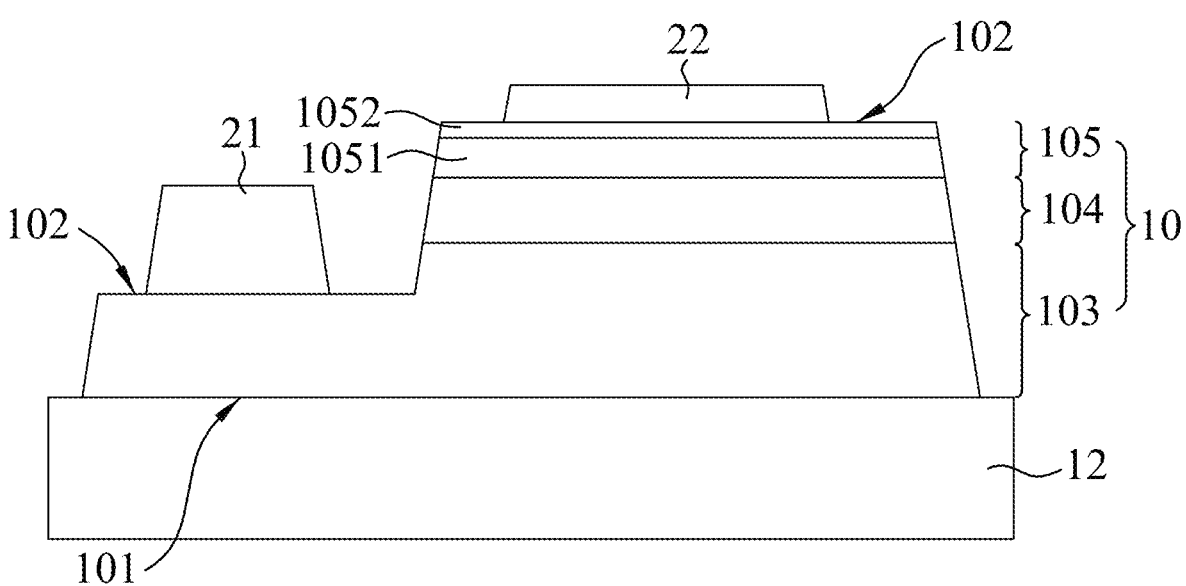
FIG. 1 is a schematic view illustrating a first embodiment of a light emitting diode according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
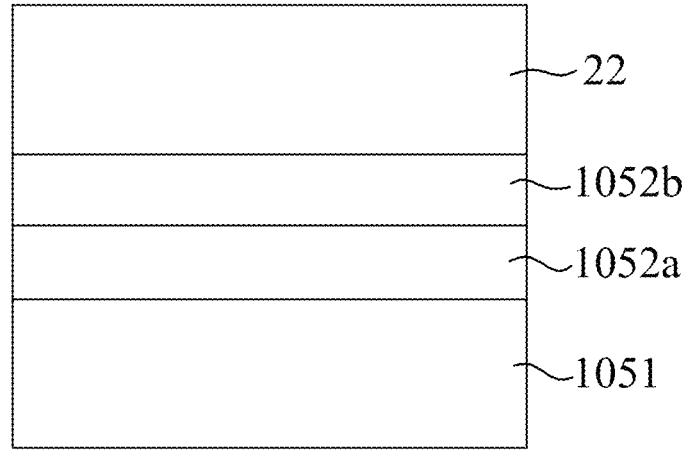
FIG. 2 is a schematic view illustrating a P-type semiconductor layer and a second electrode of the embodiment.

Referring to FIGS. 1 and 2, FIG. 1 is a schematic view illustrating a first embodiment of a light emitting diode according to the disclosure, and FIG. 2 is a schematic view illustrating a P-type semiconductor layer 105 and a second electrode 22 of the embodiment. The first embodiment of the disclosure provides the light emitting diode as shown in FIG. 1, the light emitting diode includes a semiconductor structure 10, a first electrode 21, and a second electrode 22.

The semiconductor structure 10 is disposed on a substrate 12. The substrate 12 can be an electrically insulating substrate, and in certain embodiments, the substrate 12 can be made of a transparent material or a translucent material. In an exemplary embodiment, the substrate 12 is a sapphire substrate. In some embodiments, the substrate 12 may be a patterned sapphire substrate, but the disclosure is not limited thereto. In other embodiments, the substrate 12 may be made of an electrically conductive material or a semiconductor material. In some embodiments, the material of the substrate 12 can include at least one of silicon carbide, silicon, magnesium aluminum oxide, magnesium oxide, lithium aluminum oxide, aluminum gallium oxide, and gallium nitride.

The semiconductor structure 10 has a first surface 101 and a second surface 102, which are on opposite sides of the semiconductor structure 10. In this embodiment, the first surface 101 and the second surface 102 of the semiconductor structure 10 are respectively the lower surface and the upper surface of the semiconductor structure 10 as shown in FIG. 1. The semiconductor structure 10 also includes an N-type semiconductor layer 103, an active layer 104, and a P-type semiconductor layer 105. The active layer 104 is located between the N-type semiconductor layer 103 and the P-type semiconductor layer 105. As shown in FIG. 1, the N-type semiconductor layer 103, the active layer 104, and the P-type semiconductor layer 105 are successively stacked on the substrate 12.

The N-type semiconductor layer 103 can provide electrons to the active layer 104 when powered by an electric current. In certain embodiments, the N-type semiconductor layer 103 includes an N-type doped nitride layer. The N-type doped nitride layer may include one or more N-type dopants from the group IV elements. The N-type dopant may include silicon (Si), germanium (Ge), tin (Sn), or a combination thereof. In some embodiments, a buffer layer may be disposed between the N-type semiconductor layer 103 and the substrate 12 to reduce lattice mismatch between the substrate 12 and the N-type semiconductor layer 103. The buffer layer may include an unintentionally doped AlN layer or unintentionally doped AlGaN layers. In some embodiments, the N-type semiconductor layer 103 may also be adhered to the substrate 12 by a bonding layer. In certain embodiments, the N-type semiconductor layer 103 may include a first N-type sub-layer having a first doping concentration and a second N-type sub-layer having a second doping concentration. The first N-type sub-layer is located between the second N-type sub-layer and the active layer 104, and the first doping concentration is higher than the second doping concentration. In other embodiments, the first doping concentration is more than 1.2 times that of the second doping concentration. For example, the first doping concentration may be between 1.2 to 2 times that of the second doping concentration. The first N-type sub-layer may serve as a contact layer and have a higher doping concentration that allows for better ohmic contact with a contact electrode of a device to reduce the voltage thereof; the second N-type sub-layer may serve as a current spreading layer for improved charge carrier injection efficiency and will need to have a relatively greater thickness (1 µm or more). Therefore, the second N-type sub-layer should have a doping concentration that is slightly lower than the doping concentration of the first N-type sub-layer, which is advantageous for avoiding crystal quality decline due to too high doping concentrations, while also facilitating lateral diffusion of charge carriers. In some embodiments, the first doping concentration can be $1 \times 10^{19}/cm^3$ or more, for example, the first doping concentration may range from $1 \times 10^{19}/cm^3$ to $5 \times 10^{19}/cm^3$, the second doping concentration can be $5 \times 10^{18}/cm^3$ or more, for example, the second doping concentration may range from $5 \times 10^{18}/cm^3$ to $3 \times 10^{19}/cm^3$. The above values for the first and second doping concentrations may better balance the crystal quality and charge carrier diffusion capability of the N-type semiconductor layer 103. The thickness of the second N-type sub-layer may be 1 µm or more.

The active layer 104 may be a quantum well structure. In some embodiments, the active layer 104 is a multiple quantum well structure. The multiple quantum well structure includes a plurality of quantum well layers and a plurality of quantum barrier layers that are alternately stacked in a repeating manner. For example, the multiple quantum well structure may be a GaN/AlGaN, InAlGaN/InAlGaN, or InGaN/AlGaN structure. In addition, the composition and thickness of the quantum well layer within the active layer 104 determines the wavelength of the generated light. In order to improve the luminous efficiency of the active layer 104, the thickness of the quantum wells, the number of layers of paired quantum well layers and quantum barrier layers, and/or other features in the active layer 104 may be adjusted. In some embodiments, light emitted from the active layer 104 has a wavelength ranging from 190 nm to 380 nm. That is, the active layer 104 emits light in the ultraviolet band, and the light emitting diode is an ultraviolet light emitting diode. In some embodiments, the active layer 104 may be doped with an N-type dopant, such as Si, with a doping concentration of $1 \times 10^{18}/cm^3$ or above. In other embodiments, the active layer 104 may be doped with Si, with a doping concentration ranging from $1 \times 10^{18}/cm^3$ to $1 \times 10^{19}/cm^3$. For example, the concentration may be $2 \times 10^{18}/cm^3$ or $5 \times 10^{18}/cm^3$, etc. The photoelectric properties of the light emitting diode may be improved by doping the active layer 104 with a suitable dopant until the active layer 104 has an optimal dopant concentration.

The P-type semiconductor layer 105 provides electron-holes to the active layer 104 when powered by an electric current. In some embodiments, the P-type semiconductor layer 105 includes a P-type doped nitride layer. The P-type doped nitride layer can include one or more P-type dopants from the group II elements. The P-type dopant may include one of magnesium (Mg), zinc (Zn), beryllium (Be), or a combination thereof. The P-type semiconductor layer 105 may be a multi-layer structure having different compositions.

In some embodiments, the semiconductor structure 10 includes a restricting layer (not shown in the FiGs.) disposed between the active layer 104 and the P-type semiconductor layer 105. The restricting layer has a high aluminum (Al) content and low doping or no doping with a thickness of 50 nm or less. The restricting layer can limit the amount of dopant from the P-type semiconductor layer 105 that diffuses into the active layer 104, and improve the photoelectric properties of the light emitting diode.

The first electrode 21 is located on the second surface 102 of the semiconductor structure 10 and is electrically connected to the N-type semiconductor layer 103. The second electrode 22 is located on the second surface 102 of the semiconductor structure 10 and is electrically connected to the P-type semiconductor layer 105.

The first electrode 21 may be a single-layer structure, a double-layer structure, or a multi-layer structure. For example, the first electrode 21 may be a multi-layer structure of Ti/Al, Ti/Al/Ti/Au, Ti/Al/Ni/Au, V/Al/Pt/Au, etc. In some embodiments, the first electrode 21 may be formed directly on a mesa of the semiconductor structure 10 and have good ohmic contact with the N-type semiconductor layer 103.

The second electrode 22 may be made of a transparent conductive material or a metal material. The material of the second electrode 22 may be selected according to doping conditions of a surface layer of the P-type semiconductor layer 105. In some embodiments, the second electrode 22 is made of a transparent conductive material and may include indium tin oxide (ITO), indium zinc oxide (IZO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO) or zinc oxide (ZnO), but the disclosure is not limited thereto.

The P-type semiconductor layer 105 includes a P-type contact layer 1052 and a P-type base layer 1051. The P-type base layer 1051 is located between the P-type contact layer 1052 and the active layer 104. A P-type dopant concentration in the P-type contact layer 1052 gradually decreases along a direction from the first surface 101 towards the second surface 102 (i.e., a direction from bottom to top in FIG. 1). By virtue of gradually decreasing the P-type dopant concentration in the P-type contact layer 1052, the interface between the P-type contact layer 1052 and the second electrode 22 may be favorably disposed for reducing invalid recombination of the charge carriers via a leakage channel, thereby increasing photoelectric reliability and enhancing luminous efficiency of the light emitting diode. Meanwhile, improving the interface between the P-type contact layer 1052 and the second electrode 22 can also enhance a film-forming quality of an electron-hole compensation layer 14 (not shown in FIGS. 1, 2, but shown in FIGS. 3, 4), reduce the interference of defects on the transmission and electron-holes carrying of the electron-hole compensation layer 14, and increase the electron-hole concentration in a P region, so that the luminous efficiency of the light emitting diode can be effectively improved and luminous decay of the light emitting diode can also be lessened.

When considering the doping concentration of the P-type contact layer 1052, if the doping concentration of the P-type dopants is too high, the P-type contact layer 1052 will have excessive defects, and rough surfaces and leakage channels may form in the P-type base layer 1051 and the P-type contact layer 1052, which may lead to leakage of the light emitting diode. In addition, rough surfaces may affect the growth quality of the electron-hole compensation layer 14' and the defects may also block electron-hole migration. Therefore, the P-type dopant concentration in the P-type contact layer 1052 optimally ranges from $1 \times 10^{18}$ cm$^{-3}$ to $1 \times 10^{22}$ cm$^{-3}$. In some embodiments, the P-type dopant in the P-type contact layer 1052 may be magnesium (Mg). A magnesium dopant can increase the concentration of electron-holes, and improve electron-hole compensation and electron-hole concentration of the P-region.

In some embodiments, the P-type contact layer 1052 is divided into a first region, a second region, a third region, and a fourth region along a direction from the first surface 101 to the second surface 102 (i.e., a direction from bottom to top in FIG. 1), each of which accounts for 25% of the total thickness of the P-type contact layer 1052. The P-type dopant concentration doped in the first region is higher than the P-type dopant concentration doped in the second region, the P-type dopant concentration doped in the second region is higher than the P-type dopant concentration doped in the third region, and the P-type dopant concentration doped in the third region is higher than the P-type dopant concentration doped in the fourth region. In other embodiments, the P-type contact layer 1052 may be divided into 50 regions, 33 regions, 20 regions, 10 regions, 5 regions, 3 regions, or 2 regions with the thickness of each region being arranged to be 2%, 3.3%, 5%, 10%, 20%, 33%, or 50% of the total thickness of the P-type contact layer 1052. However, this is not a limitation of the disclosure. The P-type dopant concentrations of the regions gradually decrease along a direction from the first surface 101 towards the second surface 102. It should be noted that the P-type dopant concentration in each of the above areas refers to an average concentration of the P-type dopant doped in each area.

In some embodiments, as shown in FIG. 2, the P-type contact layer 1052 can include a first sub-layer 1052a and a second sub-layer 1052b. The first sub-layer 1052a is located between the second sub-layer 1052b and the P-type base layer 1051. That is, the first sub-layer 1052a, the second sub-layer 1052b, and the second electrode 22 are stacked sequentially on the P-type base layer 1051. A P-type dopant concentration in the first sub-layer 1052a is higher than a P-type dopant concentration in the second sub-layer 1052b. The first sub-layer 1052a has a P-type dopant concentration that ranges from $2 \times 10^{20}$ cm$^{-3}$ to $3 \times 10^{20}$ cm$^{-3}$, and the second sub-layer 1052b has a P-type dopant concentration that ranges from $1 \times 10^{19}$ cm$^{-3}$ to $2 \times 10^{20}$ cm$^{-3}$. The P-type dopant concentration in the first sub-layer 1052a refers to the average concentration of the P-type dopant doped in the first sub-layer 1052a, and the P-type dopant concentration in the second sub-layer 1052b refers to the average concentration of the P-type dopant doped in the second sub-layer 1052b. The thickness of the first sub-layer 1052a can be equal to the thickness of the second sub-layer 1052b, and can also be different from the thickness of the second sub-layer 1052b. The P-type base layer 1051 has a thickness that ranges from 50 Å to 5000 Å. In some embodiments, the first sub-layer 1052a and the second sub-layer 1052b may have a thickness ranging from 10 Å to 500 Å. If the low-doping concentration thickness occupies a greater proportion of the P-type contact layer 1052, a greater controllability of the doping cut-off concentration may be realized when forming the P-type contact layer 1052. However, the concentration changes in the early stage of the doping will have a larger fluctuation, and the flow rate of the metalorganic carrier gas may overshoot if the deposition time is too short, thereby forming a mismatch region at the interface and affecting the crystal quality. If the first sub-layer 1052a and the second sub-layer 1052b has a thickness difference that ranges within 10 Å to 990 Å, the fluctuation in doping concentration will be much less and the change in doping concentration will be more graduated along the thickness of the P-type contact layer, there will also be less mismatch, and better crystal quality; however, the cut-off concentration may deviate more from the target value.

In some embodiments, the P-type contact layer 1052 may include GaN and/or AlGaN. In some embodiments, the P-type base layer 1051 may include AlGaN and/or GaN. AlGaN enhances the light extraction performance of the light emitting diode by having less absorption in the ultraviolet band. In the case where GaN is included in the P-type contact layer 1052 or the P-type base layer 1051, since a work function of GaN is much lower than that of AlGaN, P-type doping of GaN is less difficult to perform and the activation efficiency is high. The GaN material may form stable electrical contact with chip electrodes and is conducive for carrier injection.

In some embodiments, the P-type contact layer 1052 has a thickness that ranges from 10 Å to 1000 Å. These parameters are provided by considering the limitations of the fabrication equipment and the need to facilitate the quantum tunneling. In some embodiments, considering that the P-type base layer 1051 absorbs some of the light emitted by the active layer 104, the P-type base layer 1051 should optimally be made thinner, and may have a thickness that ranges from 50 Å to 5000 Å.

In this embodiment, the second electrode 22 is made of an ITO film material, which is widely used and researched on ultraviolet LED devices. However, the ITO film layer has a higher absorption coefficient in the deep ultraviolet band and reduces the light extraction efficiency of the device. In general, the absorption of deep ultraviolet light is reduced by reducing the thickness of the ITO film layer, so as to improve the light extraction efficiency of the LED device, whereas reducing the thickness of the ITO film layer by too much may decrease the stability of the LED. Accordingly, in consideration of the absorptive property and the contact characteristics of the electrode material, a high work function material is used for the second electrode 22, the work function of the high work function material is greater than 4.25 eV. The second electrode 22 of the high work function material can form good ohmic contact with low electrical resistance with the P-type contact layer 1052, and the reflection performance is also better than that of the ITO film layer. In some embodiments, the second electrode 22 is made of a nickel (Ni) alloy material or a protactinium (Pa) alloy material.

In some embodiments, the second electrode 22 has a thickness that ranges from 50 Å to 3000 Å. The lowest thickness of the second electrode 22 is set to 50 Å to ensure interface photoelectric stability. If the second electrode 22 is too thinned, the second electrode 22 will be easily affected by the tensile stress of a material above it during the fabrication process that may result in regional peeling and poor adhesion between the second electrode 22 and the material below it which creates unfavorable situations such as process failures or electrical testing instability.

Figure 3:
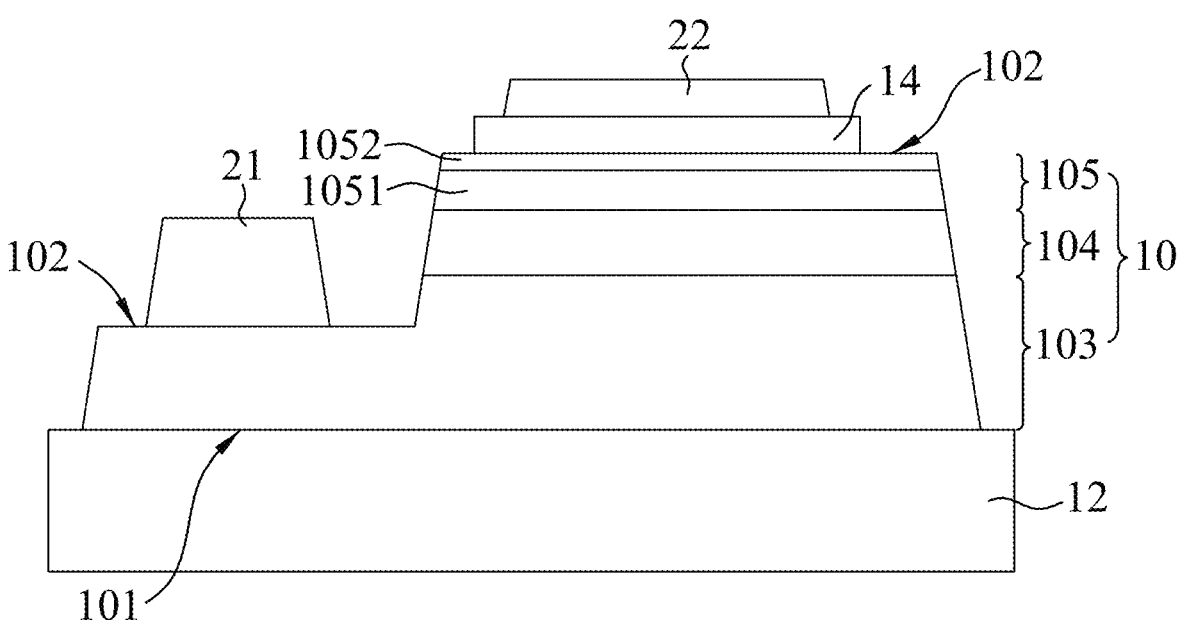
FIG. 3 is a schematic view illustrating a second embodiment of a light emitting diode according to the disclosure.
Figure 4:
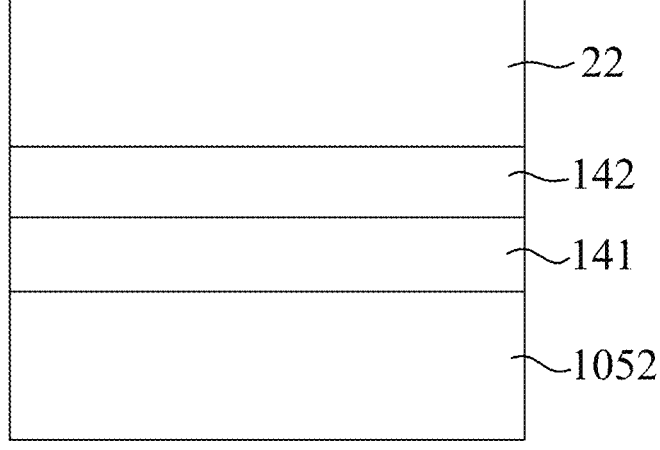
FIG. 4 is a schematic view illustrating an electron-hole compensation layer and a second electrode according to the second embodiment.

A second embodiment of the light emitting diode according to the present disclosure is shown in FIG. 3 and FIG. 4. Compared with the light emitting diode of the first embodiment shown in FIG. 1, the light emitting diode of the second embodiment is different in that the light emitting diode can further include an electron-hole compensation layer 14. The electron-hole compensation layer 14 is located between the P-type contact layer 1052 and the second electrode 22. Given that the lattice mismatch of the P-type base layer 1051 (e.g., AlGaN) and the P-type contact layer 1052 (e.g., P—GaN) is higher, the P-type contact layer 1052 is theoretically more difficult to grow, the defect density is higher, and the electron-hole is more likely to be captured during transport. Therefore, the electron-hole compensation layer 14 is disposed to provide electron-hole supplementation, which helps to improve injection efficiency. In other words, the electron-hole compensation layer 14 is used to increase electron-hole concentration and help limit the formation of rough surfaces (inhibiting dislocation scattering as well as Auger effect). In certain embodiments, the electron-hole compensation layer 14 is a NiO layer, and the band gap of NiO is relatively high, so that the electron-holes are not easily captured by defects and have better performance. Doping the NiO layer with Mg provide the following advantages: NiO has a band gap of 3.5 eV, MgO has a band gap of 7.8 eV, NiO doped with 5% Mg has a band gap of 3.5 eV*0.95+7.8 eV*0.05=3.7 eV, which is beneficial to enhance electron-hole transport capability and electron blocking to reduce Auger recombination; depending on the concentration of doped Mg, the NiO band gap may be converted from 3.5 eV to a higher band gap, which ensures that Ni electron-holes are not easily captured by epitaxial defects or free electrons, further improving electron-hole compensation and transport capabilities of the P region.

A P-type material that is suitably doped with Mg should be selected for the NiO layer to further optimize the photoelectric properties of the device. When the Mg content is too low, NiO layer is insufficient to supplement the electron-hole of the P-type materials; when the Mg content is too high, the defects of the P-type material may form rough surfaces affecting the growth quality of the NiO layer, and the defects block electron-hole migration and so on. In some embodiments, the Mg dopant concentration in the NiO electron-hole compensation layer 14 ranges from $1\times10^{18}$ cm$^{-3}$ to $1\times10^{22}$ cm$^{-3}$. In some embodiments, the percentage of Mg doped in the NiO layer is in the range of 0.1% to 5%, such as 1%, 1.5%, 2%, 2.5%, etc. The electron-hole compensation layer 14 has a thickness that ranges from 30 Å to 200 Å.

In some embodiments, as shown in FIG. 4, the electron-hole compensation layer 14 can include a first compensation layer 141 and a second compensation layer 142. The first compensation layer 141 is located between the P-type contact layer 1052 and the second compensation layer 142. In other words, the first compensation layer 141, the second compensation layer 142 and the second electrode 22 are successively stacked on the surface of the P-type contact layer 1052. Both the first compensation layer 141 and the second compensation layer 142 employ NiO, which has band gap that is relatively high, so that defects do not easily capture electron-holes, and the performance thereof is better. In some embodiments, the first compensation layer 141 is doped with Mg, and the second compensation layer 142 is not doped with Mg. The second compensation layer 142 without Mg doping can act as a diffusion buffer layer to prevent excessive Mg from entering the Ni alloy metal structure to form a magnesium metal compound (most magnesium metal compounds are brittle, which reduces the structural strength and is detrimental for the top layer of a structure), thereby increasing the reliability of the light emitting diode.

Figure 5:
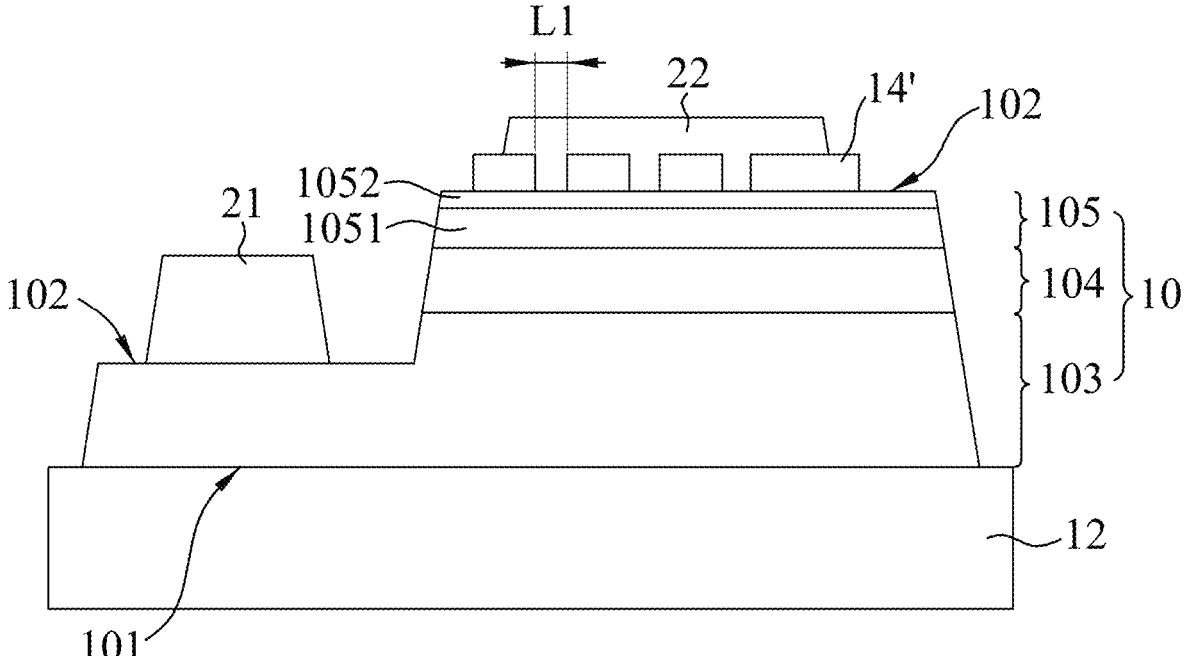
FIG. 5 is a schematic view illustrating a third embodiment of a light emitting diode according to the disclosure showing gaps in the electron-hole compensation layer.

Referring to FIG. 5, FIG. 5 is a schematic view illustrating a third embodiment of a light emitting diode according to the disclosure. Compared with the light emitting diode of the second embodiment shown in FIG. 2, the light emitting diode of the third embodiment is different in that: the electron-hole compensation layer 14 is a discontinuous electron-hole compensation layer 14'. The light reflection performance of the discontinuous electron-hole compensation layer 14' is better. Since the electron-hole compensation layer 14 (such as a NiO layer) will absorb part of the light emitted by the active layers 104, when the layer is discontinuous, light absorption will be reduced, thereby improving the light extraction performance of the light emitting diode. In some embodiments, each gap L1 within the discontinuous electron-hole compensation layer 14' has a width that ranges from 0.1 μm to 300 μm. 0.1 μm is the precision limit of the LED mask and 300 μm is the diffusion limit of a current on a conventional electrode finger. In other embodiments, the upper range limit of each gap L1 is 40 μm. The width of the gaps L1 refers to the distance between two adjacent discontinuous layer elements of the discontinuous electron-hole compensation layer 14', and the widths can be the same or different. For example, as shown in FIG. 5, the discontinuous electron-hole compensation layer 14' has three gaps L1 from left to right, which are successively named as the first gap, the second gap, and the third gap. The numeric values of the width of the first gap, the second gap and the third gap can be the same or different, and can be selected according to actual reflection requirements.

Figure 6:
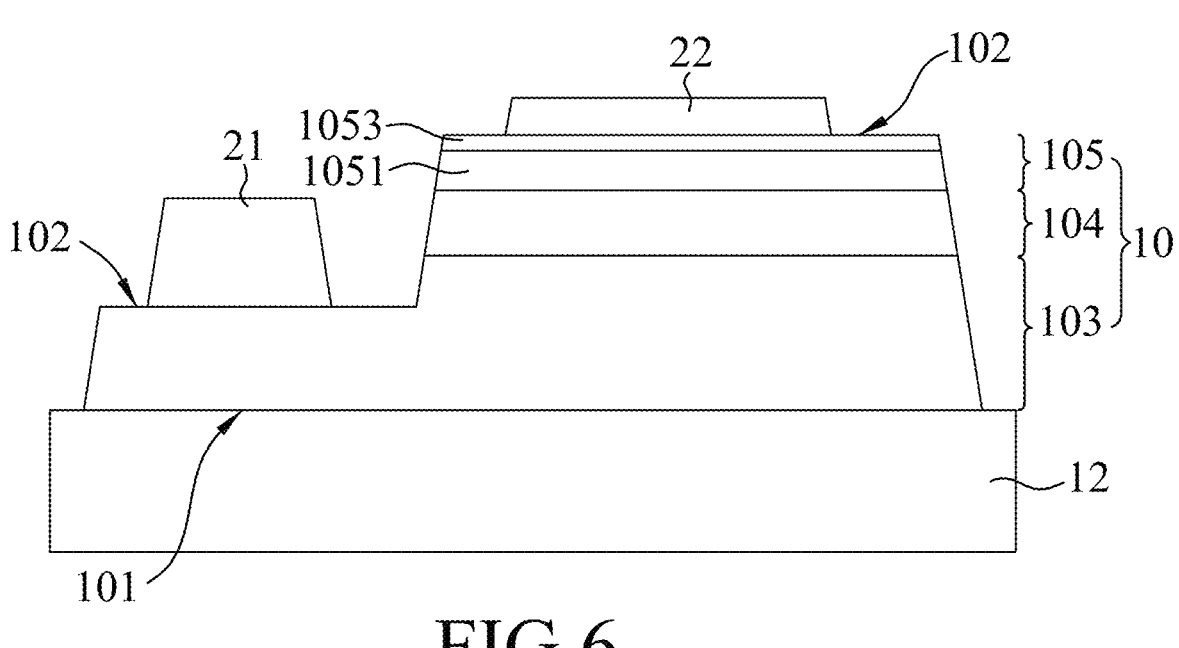
FIG. 6 is a schematic view illustrating a fourth embodiment of a light emitting diode according to the disclosure.
Figure 7:
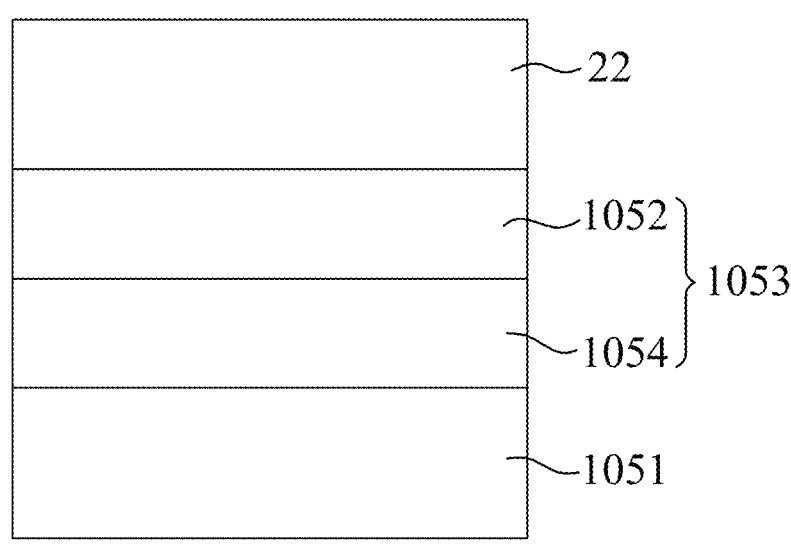
FIG. 7 is a schematic view illustrating a modified form of a P-type semiconductor layer and a second electrode according to the disclosure.

Referring to FIGS. 6 and 7, FIG. 6 is a schematic view illustrating a fourth embodiment of a light emitting diode according to the disclosure, and FIG. 7 is a partially schematic view illustrating a modified form of a P-type semiconductor layer 105 and a second electrode 22 according to the disclosure. Compared with the light emitting diode of the first embodiment shown in FIG. 1, the light emitting diode of the fourth embodiment is different in that the P-type semiconductor layer 105 includes a P-type heavily doped layer 1053 and a P-type base layer 1051, and the P-type base layer 1051 is located between the P-type heavily doped layer 1053 and the active layer 104. A P-type dopant concentration in the P-type heavily doped layer 1053 first increases and then decreases along a direction from the first surface 101 towards the second surface 102. By means of first increasing and then decreasing the P-type dopant concentration in the P-type highly doped layer 1053, the luminous efficiency of the light emitting diode can be effectively improved, and the luminous decay of the light emitting diode can also be markedly improved.

In some embodiments, as shown in FIG. 7, the P-type semiconductor layer 105 includes a P-type hole injection layer 1054 located between the P-type base layer 1051 and the P-type contact layer 1052. More specifically, in this embodiment, the P-type heavily doped layer 1053 includes the P-type hole injection layer 1054 and the P-type contact layer 1052 successively stacked on the P-type base layer 1051. A P-type dopant concentration in the P-type hole injection layer 1054 gradually increases along a direction from the first surface 101 towards the second surface 102, and a P-type dopant concentration in the P-type contact layer 1052 gradually decreases along the direction from the first surface 101 towards the second surface 102. In this way, the luminous efficiency of the light emitting diode can be effectively improved, and the luminous decay of the light emitting diode can also be significantly improved. The P-type contact layer 1052 of the present embodiment may refer to the related descriptions about the P-type contact layer 1052 in the first embodiment. In certain embodiments, the P-type dopant concentration in the P-type contact layer 1052 proximal to the first surface 101 is greater than the P-type dopant concentration in the P-type contact layer 1052 proximal to the second surface 102. In other embodiments, the P-type dopant concentration in the P-type contact layer 1052 ranges from $1 \times 10^{18}$ cm$^{-3}$ to $1 \times 10^{22}$ cm$^{-3}$, and the P-type dopant concentration in the P-type hole injection layer 1054 ranges from $1 \times 10^{17}$ cm$^{-3}$ to $1 \times 10^{22}$ cm$^{-3}$.

In other words, in some embodiments, the P-type semiconductor layer 105 includes the P-type hole injection layer 1054 located between the P-type base layer 1051 and the P-type contact layer 1052, and a P-type dopant concentration in the P-type hole injection layer 1054 increases gradually along the direction from the first surface 101 towards the second surface 102.

Figure 8A:
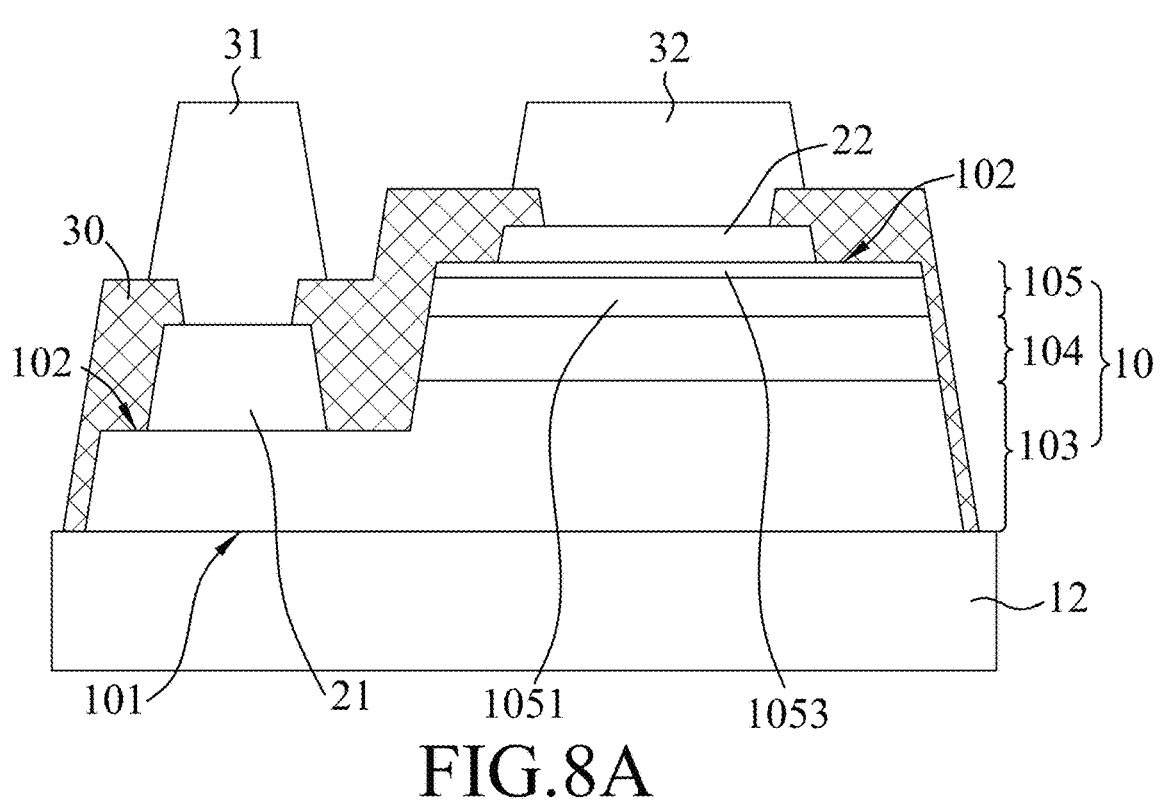
FIG. 8A is a schematic view illustrating a fifth embodiment of a light emitting diode according to the disclosure.
Figure 8B:
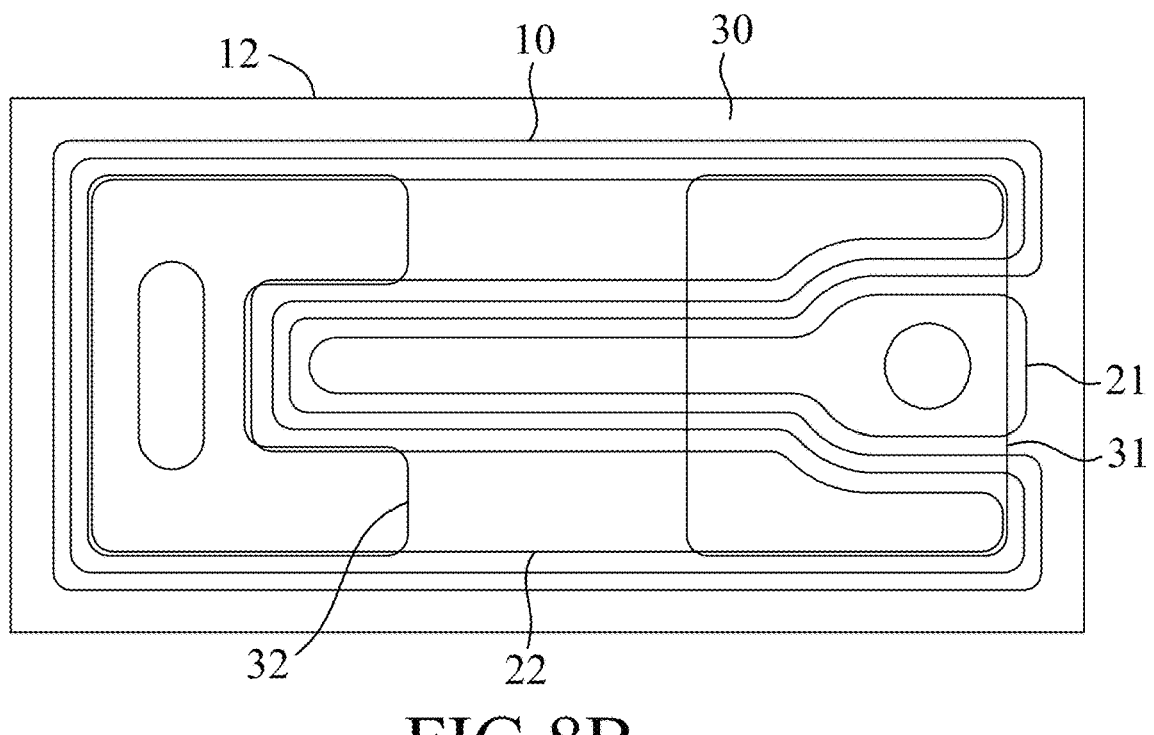
FIG. 8B is a schematic top view illustrating of the fifth embodiment.

FIG. 8A is a schematic view illustrating a fifth embodiment of a light emitting diode according to the disclosure and FIG. 8B is a schematic top view illustrating of fifth embodiment. Compared with the light emitting diode of the fourth embodiment as shown in FIG. 6, the light emitting diode of the fifth embodiment is different in that the light emitting diode includes an insulating layer 30, a first electrode pad 31, and a second electrode pad 32. The insulating layer 30 covers the semiconductor structure 10, and the insulating layer 30 mainly provides insulation protection. The insulating layer 30 has different effects according to its location thereof. For example, when the insulating layer 30 covers the sidewalls of the semiconductor structure 10, it can be used to prevent an electrical conduction between the N-type semiconductor layer 103 and the P-type semiconductor layer 105 due to exposure of the conductive material and therefore reduce chances of a short circuit. However, this is not a limitation of the disclosure. The material of the insulating layer 30 includes a non-conductive material. The non-conductive material may include an inorganic material or a dielectric material. The inorganic material may include silica gel. The dielectric material includes electrically insulating materials such as aluminum oxide, silicon nitride, silicon oxide, titanium oxide, or magnesium fluoride. In some embodiments, the insulating layer 30 can be silicon dioxide, silicon nitride, titanium oxide, tantalum oxide, niobium oxide, barium titanate, or a combination thereof. An example of the combination may be a distributed Bragg reflector (DBR) formed by repeated stack of two materials with different refractive indices.

The first electrode pad 31 and the second electrode pad 32 are located on the insulating layer 30. The first electrode pad 31 and the second electrode pad 32 are electrically connected to the first electrode 21 and the second electrode 22, respectively, through openings of the insulating layer 30. The first electrode pad 31 and the second electrode pad 32 can be formed using the same material in the same process, and thus can have the same structure.

In addition, the light emitting diode in the first embodiment, the second embodiment, the third embodiment, and the fourth embodiment may be provided with an insulating layer 30 to achieve the effect of electrical insulation and enhance the stability of the light emitting diode. The light emitting diode in the first embodiment, the second embodiment, the third embodiment and the fourth embodiment may also be provided with the first pad electrode 31 and the second pad electrode 32, which are convenient for installation and use of the light emitting diode, etc.

Figure 9:
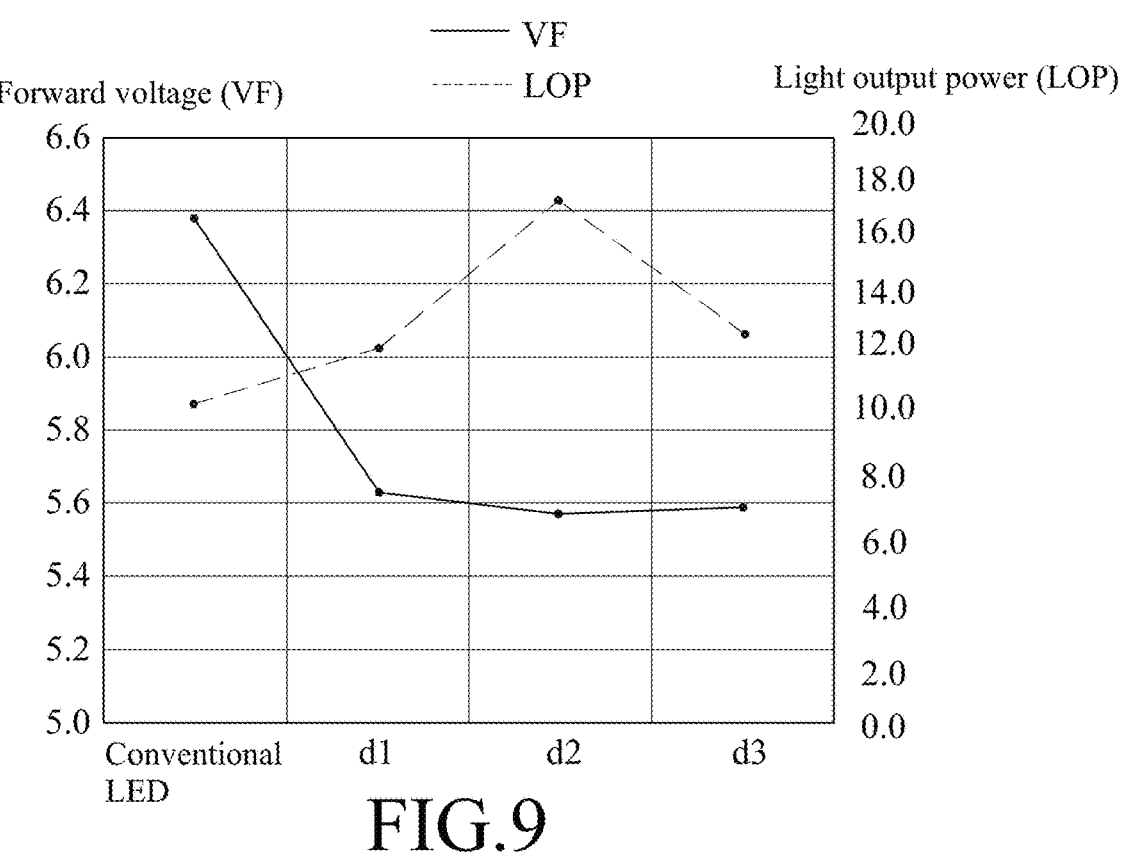
FIG. 9 is a graph showing a luminous efficacy comparison of various light emitting diodes according to the disclosure and a conventional light emitting diode.

Referring to FIG. 9, the longitudinal axis on the left represents forward voltage (VF), the longitudinal axis on the right of FIG. 9 represents light output power (LOP), and a conventional light emitting diode (that has no Mg doped NiO layer and no gradually decreased Mg dopant concentration) and light emitting diodes (of the second embodiment) with different Mg doping concentrations (labelled d1, d2, and d3) in the NiO layer (electron-hole compensation layer 14) are respectively labelled horizontally across. The VF is about 6.35 V and the LOP is about 10.84 mW for the conventional light emitting diode. The VF is about 5.65 V and the LOP is about 12.71 mW for the light emitting diode with d1 doping concentration. The VF is about 5.53 V and the LOP is about 18.16 mW in the light emitting diode with d2 doping concentration. The VF is about 5.55 V and the LOP is about 13.6 mW in the light emitting diode with d3 doping concentration. As seen in FIG. 9, compared with the conventional light emitting diode, the forward voltages of the light emitting diodes with different Mg doping concentrations in the NiO layer are all reduced, and the luminance is increased. Therefore, the luminous efficiency of the light emitting diodes are effectively improved with Mg doping. The Mg doping concentration relationship is d1>d2>d3. The concentration of d1 may range from $5\times10^{20}$ cm$^{-3}$ to $8\times10^{20}$ cm$^{-3}$, the concentration of d2 may range from $1\times10^{20}$ cm$^{-3}$ to $5\times10^{20}$ cm$^{-3}$, and the concentration of d3 may range from $5\times10^{19}$ cm$^{-3}$ to $8\times10^{19}$ cm$^{-3}$.

Figure 10:
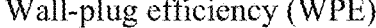
FIG. 10 is a graph illustrating a Wall-Plug-Efficiency (WPE) comparison of the light emitting diodes according to the disclosure and the conventional light emitting diode.
Figure 10:
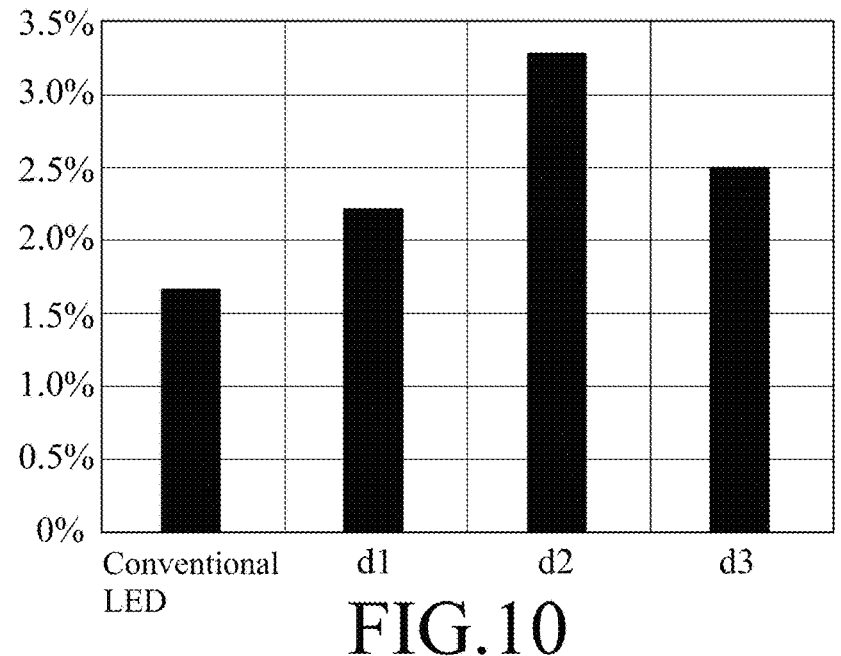

Referring to FIG. 10, the longitudinal axis in FIG. 10 represent WPE, which refers to wall-plug efficiency, and the conventional light emitting diode and the light emitting diodes with different Mg doping concentrations in the NiO layer (electron-hole compensation layer 14) from FIG. 9 are respectively labelled horizontally in the same order as FIG. 9. The WPE of the conventional light emitting diode is about 1.7%; the WPE of the light emitting diode with d1 doping concentration is about 2.2%; the WPE of the light emitting diode with d2 doping concentration is about 3.3%; the WPE of the light emitting diode with d3 doping concentration is about 2.5%. As seen in FIG. 10, compared with the conventional light emitting diode, the WPE of the light emitting diodes with different Mg doping concentrations in the NiO layer are all increased. Therefore, the luminous efficiency of the light emitting diodes are effectively improved.

Figure 11:
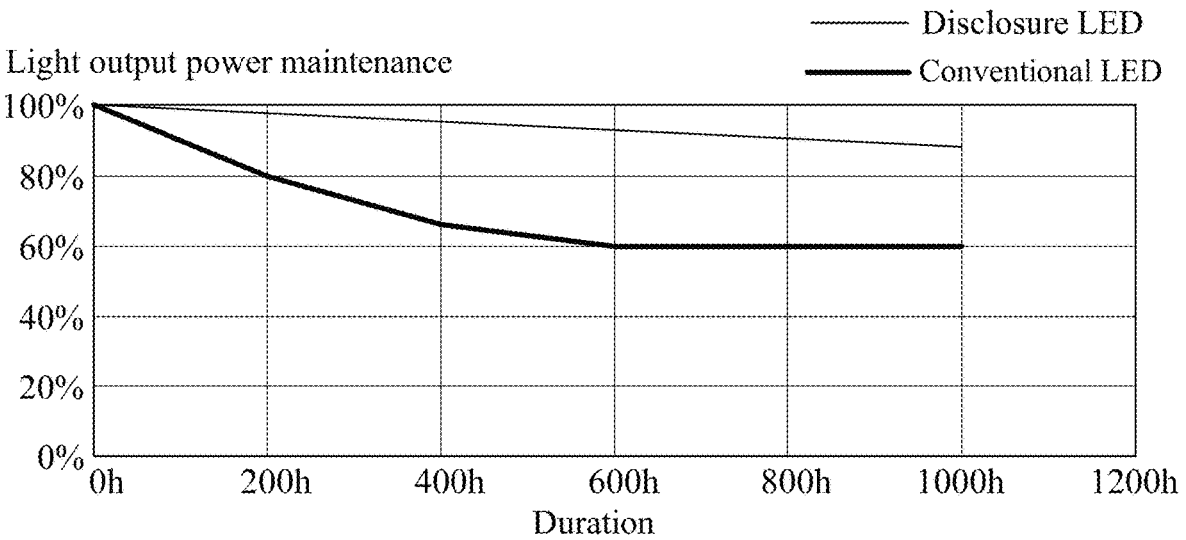
FIG. 11 is graph illustrating an aging comparison of the light emitting diodes according to the disclosure and the conventional light emitting diode.

Referring to FIG. 11, the horizontal axis represents duration and the longitudinal axis represents a light output power maintenance (light output power maintenance equals the light output power of the device after aging for 1008 hours divided by the initial aging light output power of the device at 0 hours). The aging conditions of FIG. 11 are a temperature of 45° C., a current of 150 mA, and a duration of 1008 hours. After long-term aging, compared with the conventional light emitting diode, the light emitting diode of the disclosure (with the same Mg doping concentration as d2) enhances the light output power maintenance from 59.1% to 90.1%, and the luminous decay of the light emitting diode can also be markedly improved.

Figure 12:
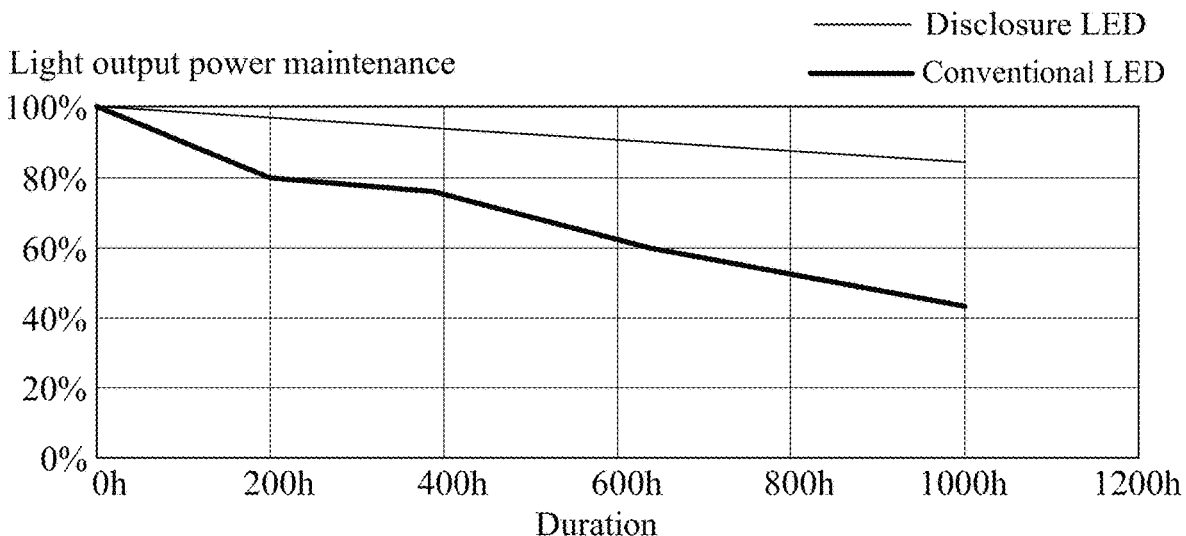
FIG. 12 is graph illustrating an aging comparison schematic view of the light emitting diodes according to the disclosure and the conventional light emitting diode.

Referring to FIG. 12, the horizontal axis in FIG. 12 represents duration and the longitudinal axis in FIG. 12 represents the light output power maintenance. The aging conditions of FIG. 12 are at a humidity of 85%, a temperature of 85° C., a current of 100 mA, and a duration of 1008 hours. As shown in FIG. 12 after long-term aging, compared with the conventional light emitting diode, the light emitting diode of the disclosure (with the same Mg doping concentration as d2) enhances the light output power maintenance from 44.4% to 88.2%, and the luminous decay of the light emitting diode can also be markedly improved.

Figure 13:
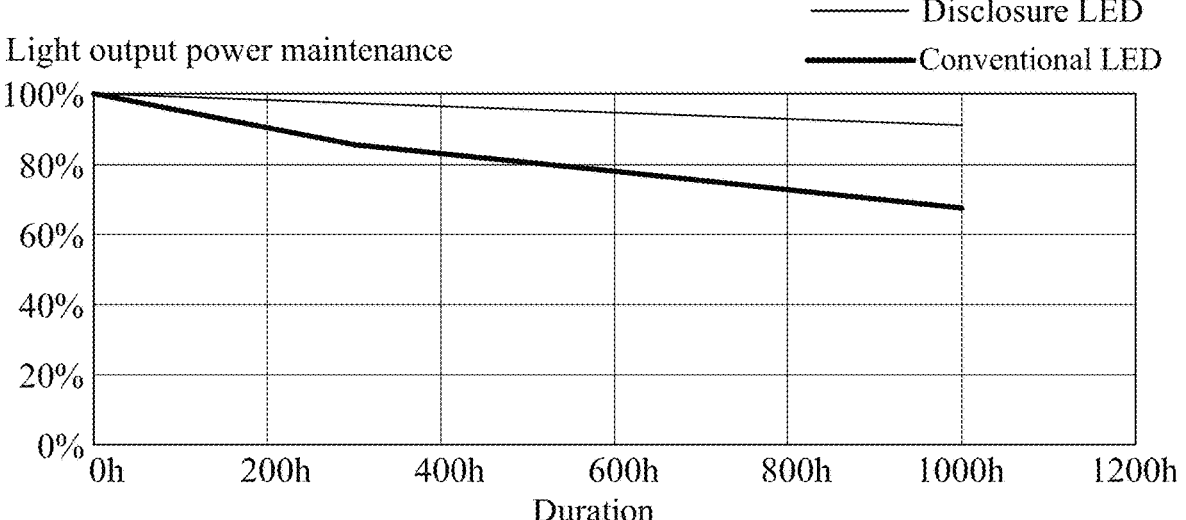
FIG. 13 is graph showing an aging comparison schematic view of the light emitting diodes according to the disclosure and the conventional light emitting diode.

Referring to FIG. 13, the horizontal axis in FIG. 13 represents duration and the longitudinal axis in FIG. 13 represents the light output power maintenance. The aging conditions of FIG. 13 are at a temperature of 45° C., a current of 100 mA, and a duration of 1008 hours. After long-term aging, compared with the conventional light emitting diode, the light emitting diode of the disclosure (with the same Mg doping concentration as d2) enhances the light output power maintenance from 70.9% to 91.2%, and the aging luminous decay of the light emitting diode can also be markedly improved.

The disclosure also provides a light emitting device, which includes the light emitting diode described in any of the aforesaid embodiments of the disclosure.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light emitting diode comprising: an semiconductor structure having a first surface and a second surface, said semiconductor structure including an N-type semiconductor layer, an active layer, and a P-type semiconductor layer that includes a P-type contact layer, and a P-type base layer located between said P-type contact layer and said active layer, said active layer being located between said N-type semiconductor layer and said P-type semiconductor layer; a first electrode located on said second surface of said semiconductor structure, and electrically connected to said N-type semiconductor layer; and a second electrode located on said second surface of said semiconductor structure, and electrically connected to said P-type semiconductor layer; wherein a P-type dopant concentration in said P-type contact layer gradually decreases along a direction from said first surface towards said second surface, wherein: said P-type semiconductor layer further includes a P-type hole injection layer located between said P-type base layer and said P-type contact layer; and a P-type dopant concentration in said P-type hole injection layer gradually increases along a direction from the first surface towards said second surface.

2. The light emitting diode as claimed in claim 1, wherein light emitted from said active layer has a wavelength that ranges from 190 nm to 380 nm.

3. The light emitting diode as claimed in claim 1, wherein said P-type dopant concentration in said P-type contact layer ranges from $1\times10^{18}$ cm$^{-3}$ to $1\times10^{22}$ cm$^{-3}$.

4. The light emitting diode as claimed in claim 1, wherein said P-type contact layer includes GaN or AlGaN.

5. The light emitting diode as claimed in claim 1, wherein said P-type contact layer has a thickness that ranges from 10 Å to 1000 Å.

6. The light emitting diode as claimed in claim 1, wherein: said P-type contact layer includes a first sub-layer, and a second sub-layer;

said first sub-layer is located between said second sub-layer and said P-type base layer, and has a P-type dopant concentration that ranges from $2\times10^{20}$ cm$^{-3}$ to $3\times10^{20}$ cm$^{-3}$; and said second sub-layer has a P-type dopant concentration that ranges from $1\times10^{19}$ cm$^{-3}$ to $2\times10^{20}$ cm$^{-3}$.

7. The light emitting diode as claimed in claim 1, wherein said P-type base layer includes one of AlGaN, and GaN, or a combination thereof.

8. The light emitting diode as claimed in claim 1, wherein said P-type base layer has a thickness that ranges from 50 Å to 5000 Å.

9. The light emitting diode as claimed in claim 1, wherein said second electrode includes a high work function material with a work function greater than 4.25 eV.

10. The light emitting diode as claimed in claim 9, wherein said second electrode is made of a nickel (Ni) alloy material.

11. The light emitting diode as claimed in claim 9, wherein said second electrode has a thickness that ranges from 50 Å to 3000 Å.

12. The light emitting diode as claimed in claim 1, further comprising an electron-hole compensation layer located between said P-type contact layer and said second electrode.

13. The light emitting diode as claimed in claim 12, wherein an Mg dopant concentration in said electron-hole compensation layer ranges from $1 \times 10^{18}$ cm$^{-3}$ to $1 \times 10^{22}$ cm$^{-3}$.

14. The light emitting diode as claimed in claim 12, wherein said electron-hole compensation layer has a thickness that ranges from 30 Å to 200 Å.

15. The light emitting diode as claimed in claim 12, wherein said electron-hole compensation layer is a NiO layer.

16. The light emitting diode as claimed in claim 15, wherein said electron-hole compensation layer includes a first compensation layer and a second compensation layer, said first compensation layer being located between said P-type contact layer and said second compensation layer, said first compensation layer having an Mg dopant, and the second compensation layer having no Mg dopant.

17. The light emitting diode as claimed in claim 12, wherein said electron-hole compensation layer is a discontinuous electron-hole compensation layer.

18. The light emitting diode as claimed in claim 17, wherein each gap within said discontinuous electron-hole compensation layer has a width that ranges from 0.1 μm to 300 μm.

19. A light emitting device comprising the light emitting diode as claimed in claim 1.

* * * * *